United States Patent
Hwang et al.

(10) Patent No.: US 7,058,921 B1
(45) Date of Patent: Jun. 6, 2006

(54) METHOD AND SYSTEM FOR RESOURCE ALLOCATION IN FPGA-BASED SYSTEM-ON-CHIP (SOC)

(75) Inventors: L. James Hwang, Menlo Park, CA (US); Reno L. Sanchez, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 793 days.

(21) Appl. No.: 10/082,441

(22) Filed: Feb. 22, 2002

(51) Int. Cl.
*G06F 17/50* (2006.01)
(52) U.S. Cl. .................................. 716/17; 716/16
(58) Field of Classification Search ............. 716/1, 716/16–17
See application file for complete search history.

(56) References Cited

U.S. PATENT DOCUMENTS

| | | | |
|---|---|---|---|
| 5,361,373 A | 11/1994 | Gilson | |
| 5,537,601 A | 7/1996 | Kimura et al. | |
| 5,553,001 A * | 9/1996 | Seidel et al. | 716/4 |
| 5,600,845 A | 2/1997 | Gilson | |
| 5,652,904 A | 7/1997 | Trimberger | |
| 5,671,355 A | 9/1997 | Collins | |
| 5,752,035 A | 5/1998 | Trimberger | |
| 5,761,484 A * | 6/1998 | Agarwal et al. | 716/16 |
| 5,970,254 A | 10/1999 | Cooke et al. | |
| 6,020,755 A | 2/2000 | Andrews et al. | |
| 6,096,091 A | 8/2000 | Hartmann | |
| 6,279,045 B1 | 8/2001 | Muthujumaraswathy et al. | |
| 6,282,627 B1 | 8/2001 | Wong et al. | |
| 6,343,207 B1 | 1/2002 | Hessel et al. | |
| 6,366,945 B1 * | 4/2002 | Fong et al. | 718/104 |
| 6,408,422 B1 * | 6/2002 | Hwang et al. | 716/3 |
| 2002/0108006 A1 * | 8/2002 | Snyder | 710/100 |
| 2002/0157066 A1 * | 10/2002 | Marshall et al. | 716/1 |

OTHER PUBLICATIONS

Cary D. Snyder and Max Baron; "Xilinx's A-to-Z System Platform"; Cahners Microprocessor; The Insider's Guide to Microprocessor Hardware; Microdesign Resources; Feb. 6, 2001; pp. 1-5.
U.S. Appl. No. 10/082,440, filed Feb. 22, 2002, Sanchez et al.
U.S. Appl. No. 10/082,517, filed Feb. 22, 2002, Sanchez et al.
U.S. Appl. No. 10/082,518, filed Feb. 22, 2002, Hwang et al.

* cited by examiner

*Primary Examiner*—Stacy A. Whitmore
(74) *Attorney, Agent, or Firm*—Pablo Meles; LeRoy D. Maunu

(57) ABSTRACT

As system components which are used to customize an FPGA-based embedded processor SoC are selected and configured, the actual or estimated resources can be immediately provided. A GUI (350) can facilitate display of resources utilized by any or all selected system components, resources available for use by unselected system components and the customized device resources. Resource conflict and configuration checks can be used to identify and resolve system component problems and design and specification requirements. Notably, any associated resource problems can be immediately identified and rectified.

30 Claims, 4 Drawing Sheets

METHOD AND SYSTEM FOR RESOURCE ALLOCATION IN FPGA-BASED SYSTEM-ON-CHIP (SOC)

FIELD OF THE INVENTION

This invention relates generally to programmable logic devices, and more particularly to a method and system for optimizing the allocation of resources during development of FPGAs.

BACKGROUND OF THE INVENTION

Programmable devices are a class of general-purpose integrated circuits that can be configured for a wide variety of applications. Such programmable devices have two basic versions, mask programmable devices, which are programmed only by a manufacturer, and field programmable devices, which are programmable by the end user. In addition, programmable devices can be further categorized as programmable memory devices or programmable logic devices. Programmable memory devices include programmable read only memory (PROM), erasable programmable read only memory (EPROM) and electronically erasable programmable read only memory (EEPROM). Programmable logic devices include programmable logic array (PLA) devices, programmable array logic (PAL) devices, erasable programmable logic devices (EPLD) devices, and programmable gate arrays (PISA).

As chip capacity continues to increase significantly, the use of field programmable gate arrays (FPGAs) is quickly replacing the use of application specific integrated circuits (ASICs). An ASIC is a specialized integrated circuit that is designed for a particular application and can be implemented as a specialized microprocessor. Notably, a FPGA is a programmable logic device (PLD) that has an extremely high density of electronic gates as compared to an ASIC. This high gate density has contributed immensely to the popularity of FPGAs. Notably, FPGAs can be designed using a variety of architectures that can include user configurable input/output blocks (IOBs), and programmable logic blocks having configurable interconnects and switching capability.

The advancement of computer chip technology has also resulted in the development of embedded processors and controllers. An embedded processor or controller can be a microprocessor or microcontroller circuitry that has been integrated into an electronic device as opposed to being built as a standalone module or "plugin card." Advancement of FPGA technology has led to the development of FPGA-based system-on-chips (SoC) including FPGA-based embedded processor system-on-chips. A SoC is a fully functional product having its electronic circuitry contained on a single chip. While a microprocessor chip requires ancillary hardware electronic components to process instructions, a SoC would include all required ancillary electronics. For example, a SoC for a cellular telephone can include a microprocessor, encoder, decoder, digital signal processor (DSP), RAM and ROM. It should be understood within contemplation of the present invention that an FPGA-Based SoC does not necessarily include a microprocessor or microcontroller. For example, a SoC for a cellular telephone could also include an encoder, decoder, digital signal processor (DSP), RAM and ROM that rely on an external microprocessor. It should also be understood herein that "FPGA-based embedded processor SoCs" are a specific subset of FPGA-based SoCs that would include their own processors.

In order for device manufacturers to develop FPGA-based embedded processor SoCs or FPGA-based SoCs, it is necessary for them to acquire intellectual property rights for system components and/or related technologies that are utilized to create the FPGA-based SoCs. These system components and/or technologies are called cores or Intellectual Property (IP) cores. An electronic file containing system component information can typically be used to represent the core. A device manufacturer will generally acquire several cores that are integrated to fabricate the SoC.

Notwithstanding advantages provided by using FPGA-based SoCs, the development of these SoCs can be very challenging. Although a vast proportion of cores are commercially available, a significantly greater proportion of cores are proprietary. Proprietary cores can be called customer specific cores. Commercially available cores can typically include standardized interfaces, which can provide interconnectivity between system components from various vendors. Customer specific cores can typically include proprietary interfaces that do not readily facilitate interconnectivity between system components from other vendors. For example, customer specific cores can be written in proprietary languages, which are completely different from standardized languages. Since customer specific cores do not readily facilitate interconnectivity with other vendor's system components, integrating customer specific cores during customization of an FPGA-based SoC can be time consuming. This resulted in increased development cost and greater time-to-market. Integration of the cores can include modeling, simulating, and debugging the integrated cores in an operating environment. Simulation and modeling can be a daunting task since it can take hours if not days to simulate a few milliseconds of real time operation.

Traditional ASIC-based embedded processor SoCs have utilized fixed ASIC solutions and standard cell technology, which have very limited customization capability. Although attempts have been made to provide a fair level of choices for customization, there is minimal choice of system components or peripherals required for customizing the ASIC-based embedded processor SoC. This has resulted in a limited flexibility in matching ASIC-based embedded processor SoC solutions to system requirements. For example, the availability of system resources can dictate whether a protocol stack is hardware-based or software-based. The availability of sufficient processing power can indicate that it might be advantageous to utilize a software-based protocol stack. Similarly, the availability of sufficient FPGA resources or a high performance requirement can implicate the use of a hardware-based protocol stack.

Notably, ASIC-based embedded processor SoC solutions have high up-front development costs and high non-recurring engineering costs. A major reason for the high up-front development and non-recurring engineering costs includes deep-sub-micron issues that complicate ASIC-based embedded processor SoC solutions. These sub-micron issues can result in multiple design and system verification iterations, which not only increase development cost, but also significantly increase product cost. Moreover, the lack of IP, for example software IP, has further limited the scope of customization. Importantly, exponential rising costs and the difficulty associated with completing complex designs, often make customization unrealistic for designs that typically have budgetary and time-to-market constraints.

During development of FPGA-based embedded processor SoCs, the ability to select from a choice of system components, and to configure various software and hardware parameters can result in wide variations in system performance and system cost. Such variations can result in a significant departure from system requirements and specifications. Consequently, a method and system for optimizing resource selection and allocation during customization of FPGA-based embedded processor SoCs would be advantageous.

SUMMARY OF THE INVENTION

The invention provides analysis mechanisms and a method of providing design feedback to assist in the allocation of FPGA resources during the design and customization of an FPGA-based SoC. An FPGA device contains multiple instances of various resources, such as microprocessors, block memories, distributed memories, registers, look-up tables, arithmetic circuits, digital locked loops, and I/O buffers (it should be recognized that this list is indicative, but not exhaustive). Furthermore, the numbers of available resources will vary, depending on the particular FPGA family, or device within an FPGA family, or specific package. Because an FPGA-based SoC can be customized for a particular FPGA device, or can also be designed to target multiple devices across distinct FPGA families, it is useful to have an interactive feedback mechanism for determining the utilization and counts of the various available resources during the design and customization of an FPGA-based SoC.

The method can include selecting a first system component, e.g. a microprocessor, for customizing the FPGA-based SoC. Subsequent to selecting the first system component, the utilized and available remaining resources for the FPGA-based SoC can be determined and resource counts are presented to the designer. The method can involve an analysis step in response to component selections that verifies adherence to FPGA-based SoC design rules. In conjunction with the analysis step, the method can provide resource utilization and availability to the user, to assist in the customization of the FPGA-based SoC.

A second system component can then be chosen and customized to use available FPGA resources. It should be recognized that interconnections between the first and second system component may require dedicated FPGA resources that implicitly affect the number of available resources above and beyond the resources required for the customization of the individual first and second system components. This form of resource consumption should also be accounted in the analysis step. The customization of the FPGA-based SoC can continue in this fashion, with user selection and customization of system components, with the accompanying analysis phase providing feedback to the user at every step.

The method can further include display of resource types computed during the analysis step in conjunction with component selection and customization. In addition to "utilization and "remaining available" counts for each FPGA resource type, it is useful to provide resource utilization feedback according to system component as well. These system components can include, but are not limited to, hardware cores, software cores, hardware core parameters, software core parameters, buses, fixed-function FPGA resources, and user-specified design components.

One or more alternative system components requiring fewer resources than the available FPGA-based SoC resources can be identified and presented for selection. Computation of resource usage can further include determining any incompatibility that can exist between selected system components. If incompatibilities exist, it may be possible for one or more alternative compatible system components to be presented for replacing the incompatible system component. A system component can subsequently be selected from the presented alternative system components. System components can include, but are not limited to, a hardware core, a software core, a hardware core parameter and a software core parameter. System components can also include default parameters that are assigned and/or selected whenever a system component is selected. The assignment of default parameters for a selected system component can further include propagating default parameters throughout the customization of the FPGA-based SoC.

In another aspect of the invention, a GUI for allocating resources for a FPGA-based SoC is provided. The GUI can include a selection object for selecting a system component from a plurality of system components. The system components can be utilized for customizing the FPGA-based SoC. A display window can facilitate display of selected system components. A parameter selection object can be utilized for defining and/or selecting parameters for configuring system components displayed in the display window. The GUI can further include a resource display object for displaying one or more resources. The resources can include, but are not limited to, resources for the FPGA-based SoC, resources utilized by each selected system component and resources available for use in the FPGA-based SoC. The resource display object can be configured to update one or more of the displayed resources whenever the selection object selects a system component. The resource display object can also be configured to update displayed resources whenever the parameter selection object defines or redefines a parameter for configuring a particular system component. The selection object further comprises an alternative selection dialog, which can facilitate presentation of one or more system components that are alternatives to a selected system component.

DETAILED DESCRIPTION OF THE DRAWINGS

Figure 1:
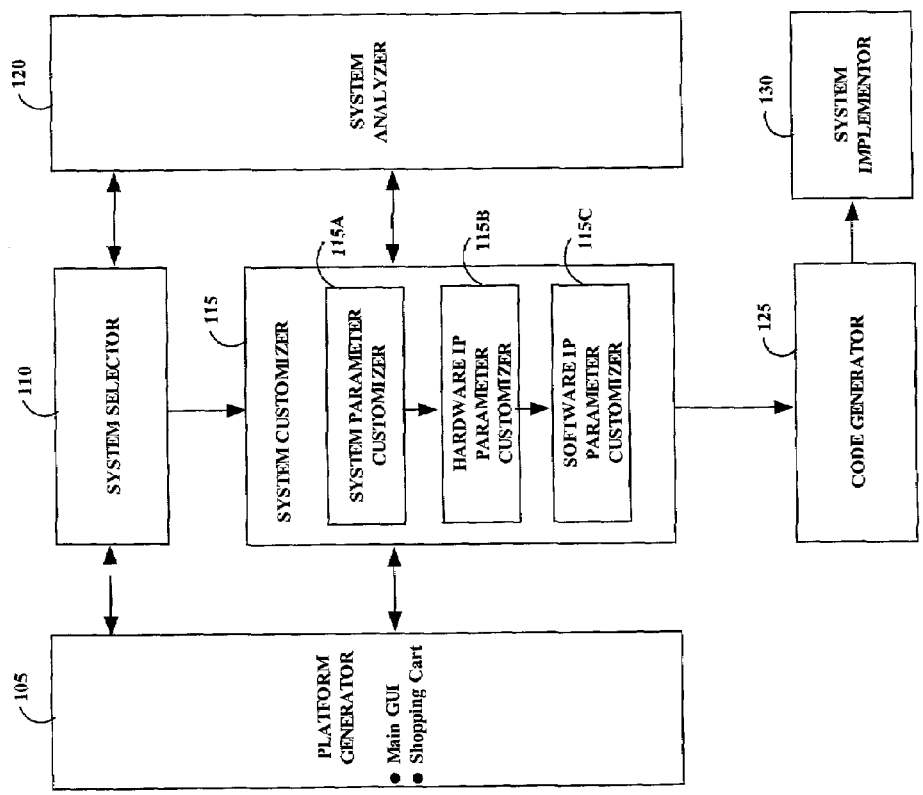
FIG. 1 is a block diagram of a processor system generator in accordance with the invention.

Referring to FIG. 1, there is shown a block diagram illustrating an exemplary system for developing and verifying an FPGA-based SoC in accordance with the invention. For illustrative purposes, and without limiting the scope of the invention, an embedded system consisting of a microprocessor, buses, memory architecture, peripherals, and software components is presented, although a system using an external microprocessor is certainly contemplated within the scope of the invention. Exemplary software components for the embedded system can include, but are not limited to, device drivers and system software, such as a real time operating system (RTOS) and protocol stacks. An exemplary development environment for this embedded system can include, but is not limited to, one or more libraries for microprocessors, peripherals, system software, and device drivers. The relevant bus architectures and memory options that can be utilized for the development of an FPGA-based SoC can be included in the libraries. Further, a good example of hardware/software function tradeoff can involve the protocol stack, which can be implemented in either hardware or software. A user may implement a protocol stack in software if there is sufficient processing power to meet all performance requirements or the user could implement the protocol stack in hardware given sufficient FPGA resources and a presumed need for higher performance.

In general, a system model can be created to facilitate design and testing of an FPGA-based SoC. The system model can include a data structure that represents the internal structure and functionality of the FPGA-based SoC. The system model can include, but is not limited to, system components, interconnections between components, and attributes, which define various characteristics and functionality of the system components and interconnections. The data structure can be a hierarchical structure, for example a tree structure, which can mirror the design hierarchy of the embedded system. This system model can also include algorithms, which can facilitate selection and customization of system components. Notably, the system model can be part of an integrated object-oriented system (OOS) that can facilitate selection and customization of the system components. Alternatively, other mechanisms and algorithms external to the system model can facilitate selection and customization of the system components.

Referring again to FIG. 1, there are shown a platform generator 105, a system selector 110, a system customizer 115, a system analyzer 120, a code generator 125 and a system implementor 130 all forming a processor system generator. The platform generator 105 can include one or more GUIs that can facilitate design of the system model. A main GUI can provide various system options and informational dialogs. The platform generator can include, a navigator GUI having one or more dialogs and/or objects, a topological GUI having one or more dialogs and/or objects and a selection customizer GUI having one or more dialogs and/or objects. One or more dialogs and/or objects can provide system component resource counts, performance estimates, power requirements and system and application software requirements. For example, a GUI can be used to display a table or chart representing the resource allocation for the system components. Advantageously, such table or chart can provide an easily readable condensed view of the system resource allocation.

The navigator dialog and/or object can provide an interactive interface that can facilitate viewing of design specification and configuration information. For example, one or more navigator objects can provide a graphical view to facilitate the insertion of a microprocessor from a library into the system model. For example, in the case where a universal asynchronous receiver/transmitter (UART) is selected as a peripheral, the navigator object and/or dialog can permit customization of the UART. The navigator dialog can also be configured to permit switching between multiple design and implementation tasks. The topological dialog can utilize a block diagram format to provide a topological view that can visually represent the existing state of the system model. The selection customizer object can permit the selection and customization of a system component. Upon selection of a system component, a GUI can include a dialog and can facilitate customization of the system component.

Platform generator 105 can have the capability to permit a particular state and/or stage of the system design and implementation to be saved and recalled at a subsequent time.

System selector 110 can be a GUI that can facilitate selection of the system components that can be used to design the FPGA-based SoC. For example, the system selector 110 can provide one or more dialogs that can permit the selection of microprocessors, microcontrollers, peripheral devices, buses, system software and application software. During selection of system components, each of the selected components can be independently treated.

The system customizer 115 can include one or more GUIs having objects and/or dialogs that can facilitate customization or configuration of system components and software. Referring to FIG. 1, there are shown a system parameter customizer 115a, a hardware intellectual property (IP) parameter customizer 115b, and a software IP parameter customizer 115c. The system parameter customizer 115a can facilitate customization of the memory map, interrupt bindings and priorities, and global and default system parameter definitions. The hardware intellectual property (IP) parameter customizer 115b can facilitate customization of device specific parameters. For example, data bus widths, IP interfaces and device specific parameters can be customized by hardware intellectual property (IP) parameter customizer 115b.

The software intellectual property (IP) parameter customizer 115c can facilitate customization of software specific parameters. For example, upon selection of a system component or a peripheral, an interrupt request (IRQ) number, a memory mapped I/O address and default initialization parameters can be assigned to the peripheral by the software IP parameter customizer 115c. In a case where a UART has been selected as a peripheral, default parameters can include, but are not limited to, stop bits, parity designation on/off, and baud rate. The customizer system 115 not only provides selection of the system components, but can also be configured to bind system parameters to system components. For example, the memory map for a particular peripheral can be bound to the peripheral giving the peripheral its unique memory address space. Furthermore, a GUI having one or more dialogs can be used to populate a system model data structure with customization parameters and/or attributes.

The system analyzer 120 can include one or more GUIs having objects and/or dialogs that can provide immediate feedback regarding architectural choices made during customization. The system analyzer 120 can include software that can have the capability to validate and analyze the system model while it is being customized. If problems including, incompatibilities, conflicts and/or system violations occur, the system analyzer 120 can issue immediate warnings and/or provide possible solutions. The system analyzer 120 can perform tasks such as system checks, parameter consistency checks, data type and value propagation checks, interconnection inference, and resource and performance analysis. Interconnection reference pertains to implications that can result from making certain connections. The system analyzer 120 can also assign device identifications (IDs) to system components and computing configuration read-only-memory (ROM) data. Exemplary system and parameter consistency checks can include, matching data bus widths of peripherals and system components, determining interrupt conflicts, determining memory map conflicts, determining memory size and usage, determining device counts, determining availability of FPGA resources and determining maximum operating frequency.

The system analyzer 120 can be configured to propagate default values, global values and/or previously defined values through the system model. For example, if a bus is configured with a default data width of 16 bits, then each peripheral that "sits on" or utilizes that bus can automatically be configured with a data width of 16 bits. It should be recognized by one skilled in the art that although a peripheral device may be automatically configured with the default bus width value, this value can be overwritten. For example, depending on the application, availability of certain devices can dictate that two (2) 8-bit devices be utilized instead of a single 16-bit device. Advantageously, the propagation of values can prevent multiple entries of similar data which typically increases development time.

During performance analysis, system analyzer 120 can have the capability to determine if system components are properly configured. For example, system analyzer 120 can identify a high-speed device that has not been configured with direct memory access (DMA). Since such a device can invariably cause a system conflict, system analyzer can consider it as a source of potential problem. System analyzer 120 can also determine whether there are too many high-speed devices residing on a low speed bus based on the device count. In this case, the system analyzer 120 can indicate the possibility of errors and/or generate possible solutions. By tracking memory usage, the system analyzer 120 can have the capability to determine whether the code space assigned in the memory map is too large for the physical memory. System analyzer 120 can also be configured to track physical resource requirements for example, slice counts for IP blocks, and width and height of specifications of IP blocks. A GUI can provide a visual display of a resulting or representative floor plan to aid with tracking and management of physical resources.

In one embodiment of the invention, system analysis tasks can be rule-based, with the architecture definition and constraints being defined in a data base, and the system analysis performed by decision queries to the data base. An example of such an analysis rule, supported data bus widths for a particular microprocessor, and the number of peripherals that can be safely put on the bus are data that would reside in an architecture definition data base. Possible mitigations in the case of a rule violation can also be embedded in the data base and used by the rule-based system analyzer. For example, there could be a rule to suggest to the user to insert a bus bridge and an additional data bus, in the case of excessive data bus loading. In another embodiment, system analysis can be algorithmic, with analysis defined by transformations on the internal representation of the SoC. An example of an algorithmic transformation is data type propagation to provide default values in system component customization GUIs. In general, system analysis will typically be performed by a combination of rule-based and algorithmic techniques.

Code generator 125 can include one or more GUIs having objects and/or dialogs that can facilitate generation of the code necessary for implementing the design of the FPGA-based embedded processor SoC or FPGA-based SoC. The code necessary for implementing the design of the FPGA-based SoC can be in a format such as a hardware description language (HDL). HDLs are commonly used to describe the functions of an electronic circuit for documentation, simulation and/or logic synthesis. Verilog and VHSIC Hardware Description Language (VHDL) are standardized HDLs which are well known by those skilled in the art. Verilog and VHDL can be used to design electronic systems at the component, board and system level. They can facilitate the development of models at a very high level of abstraction. Other formats now known or to be discovered can also be used to represent the system model.

Depending on information generated by, for example, the software IP parameter customizer 115*c*, the code generator 125 can tailor software header files," which can be used to implement the software IP of the FPGA-based SoC. Moreover, depending on the selected software IP, processors, peripherals, operating system and device drivers, code generator 125 can produce a source code directory structure that can facilitate implementation of the software IP of the FPGA-based SoC. The code generator 125 can also generate the necessary "make files," which are files used to define the rules necessary for compiling and building the code used to implement the software IP of the FPGA-based SoC. The code generator 125 can be configured to generate information that can be used for debugging. The generated information can be in an ASCII format or other suitable format and can include information such as the memory map, the configuration ROM table and the peripheral ID map.

The system implementor 130 can include one or more GUIs that can have objects and/or dialogs that can facilitate implementation of the FPGA-based SoC design. Implementation of the design can include, but is not limited to, HDL simulation and synthesis, mapping of information generated by the code generator 125, placement, routing and bitstream generation. An integrated tool or separate tools can facilitate the implementation of the FPGA-based SoC design.

Figure 2:
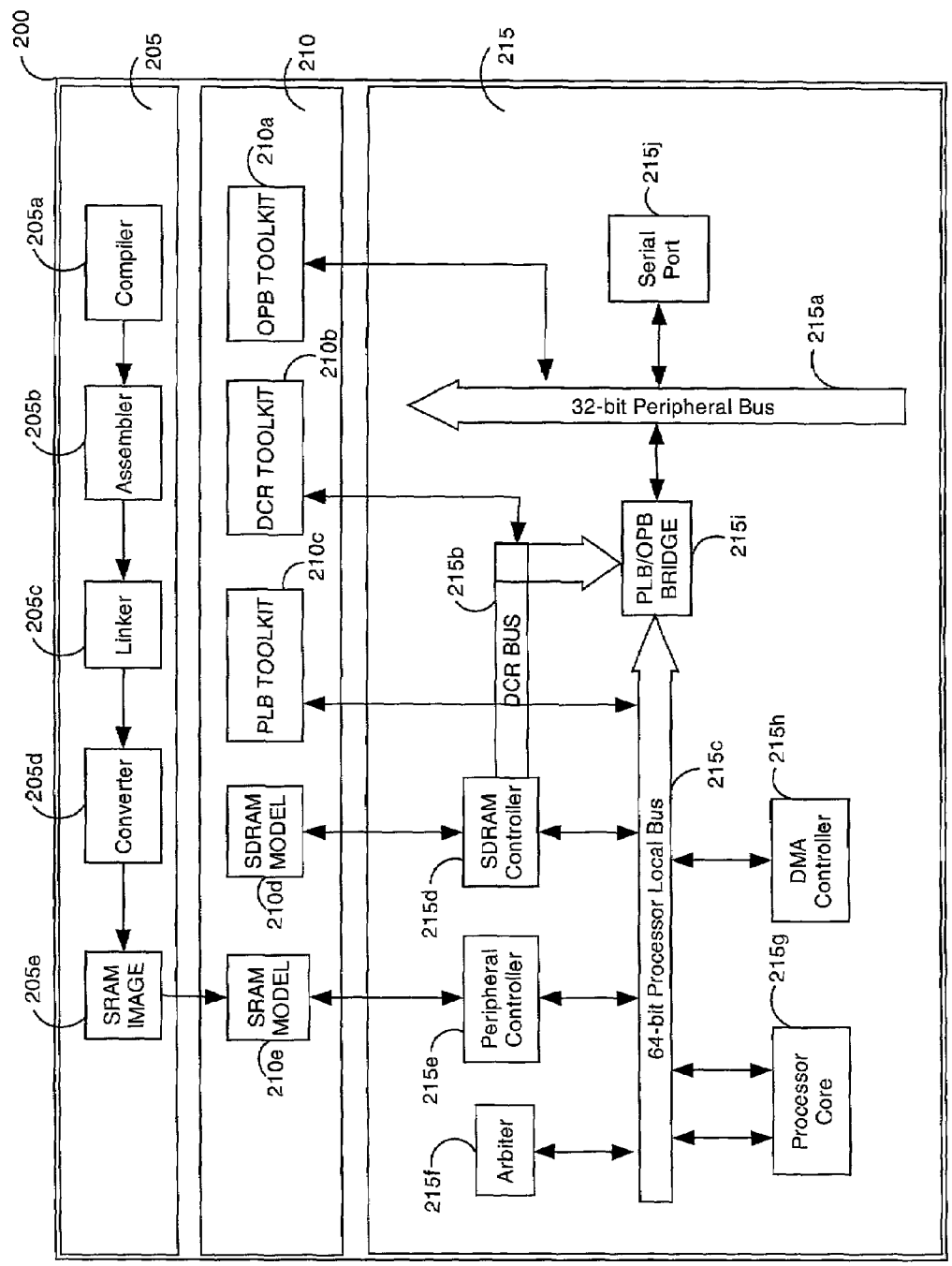
FIG. 2 depicts an exemplary topological view of the system model in accordance with the inventive arrangements.

FIG. 2 depicts an exemplary topological view of the system model in accordance with the inventive arrangements. A GUI 200 can facilitate display of the topological view of the system model. GUI 200 can include a software development window 205, a simulation model window 210 and a core model window 215. The software development window 205 can include one or more objects representing the various tools that can be used to create the code for the model system. Software development window 205 can include a compiler object 205*a*, an assembler object 205*b*, a linker object 205*c*, a converter or formatter object 205*d* and a SRAM object 205*e*. Software build tools such as compilers, assemblers, linkers, and converters are well known by those skilled in the art. Simulation model window 210 can include an OPB toolkit object 210*a*, a DCR toolkit object 210*b*, a PLB toolkit object 210*c*, an SRAM model object 210*d* and a SRAM model object 210*e*.

The core model window 215 can include objects representing the system components that comprise the system model. Core model window 215 contains a 32-bit peripheral bus 215*a*, a DCR bus 215*b*, a 64-bit processor local bus 215*c*, a SDRAM controller 215*d*, a peripheral controller 215*e*, an arbiter 215*f*, a processor core 215*g*, a DMA controller 215*h*, a PLB/OPB bridge 215*i* and a serial port 215*j*. A high level view of the interconnections between the system components is shown in the core model window 215. For example, PLB/OPB bridge 215*i* provides interconnections between buses 215*a*, 215*b* and 215*c*. Bus 215*c* facilitates communication between peripherals including arbiter 215*f*, peripheral controller 215*e*, SDRAM controller 215*d*, DMA controller 215*h* and processor core 215*g*. Arrows between the objects in the core model window 215 and the simulation model window 210 can illustrate a relationship between corresponding objects in each model window.

Figure 3:
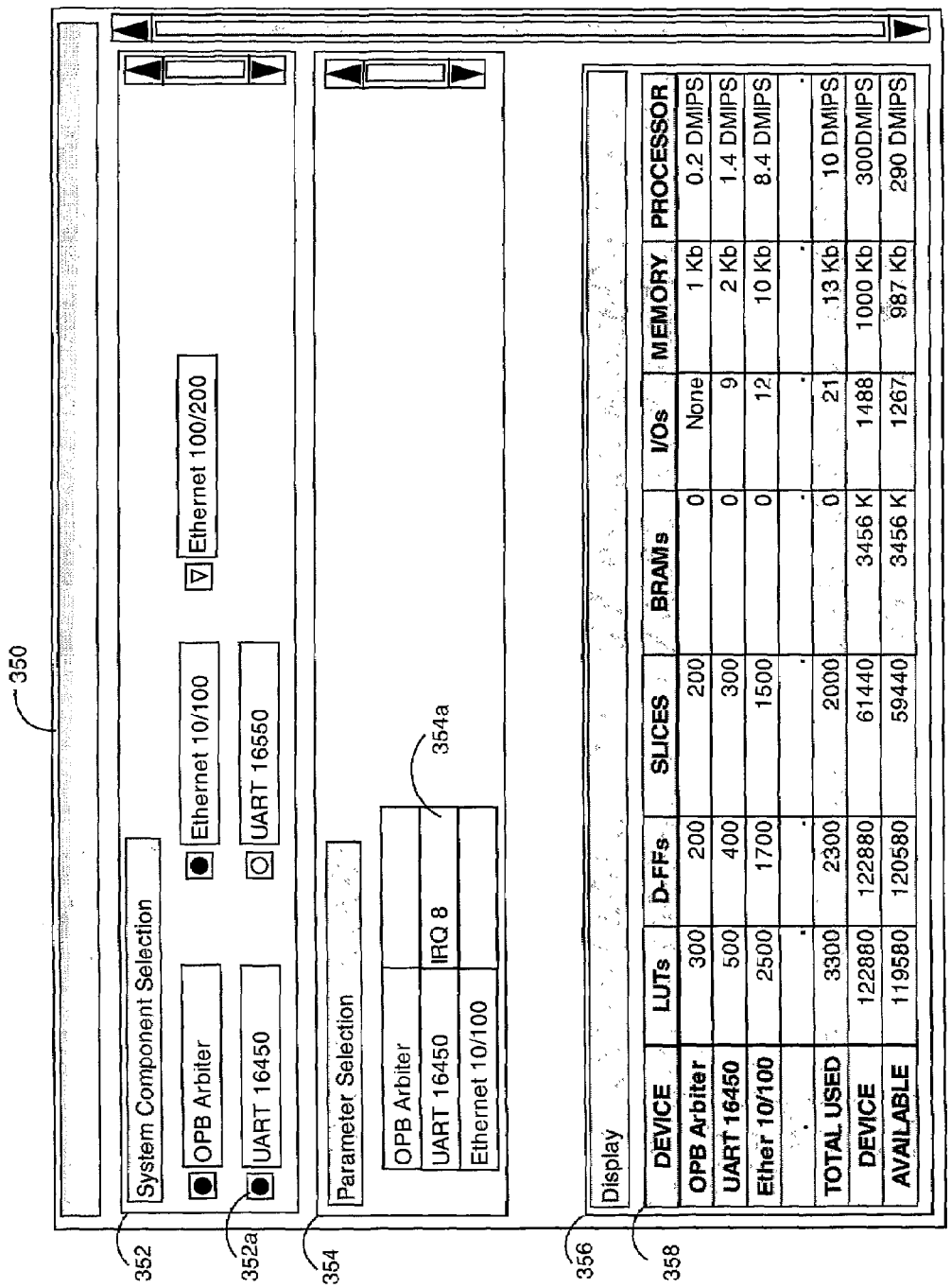
FIG. 3 depicts and exemplary GUI that can facilitate resource allocation in accordance with the invention.

FIG. 3 depicts and exemplary GUI 350 that can facilitate resource allocation in accordance with the invention. GUI 350 can include a system component selection object 352, a parameter selection object 354 and a display window 356. The system component selection object 352 can facilitate selection of system components that can be used to configure the FPGA-based embedded processor SoC. System component selection object 352 can include a window having a plurality of system components that can readily be selected. For example, a radio button 352a can be highlighted to select UART 16450 as a system component for configuring the FPGA-based embedded processor SoC. Alternatively, one or more pull-down menus can be used to facilitate the selection of system components by their functionality.

Parameter selection object 354 can include one or more dialogs that can facilitate entry and or selection of parameters that can be used to configure system components. For example, system component UART 16450 can be configured with parameter 354a that indicates the use of interrupt request number 8 (IRQ8). The display window 356 can include a window having one or more objects representing allocation and use of resources.

Display window 356 can include one or more objects that can display the allocation of system resources as the system components are selected. A table object 358 can provide a condensed view of the allocation, usage and availability of the FPGA-based embedded processor SoC resources. The table object 358 illustrates exemplary resources, which can include LUTs, D-FFS, Slices, BRAMS, I/Os, Memory and processor power. Specifically, the table object shows a breakdown of particular resources utilized by each device or system component and also the total resources utilized by all the system components. The available resources can be computed based on the total utilized resources and the total device resources. For example, there are 122880 D-flip flops (D-FFs) available in the FPGA-based embedded processor SoC. Upon selection and configuration of system component OPB arbiter, OPB arbiter utilizes 200 D-FFs, UART 16450 utilizes 400 D-FFs, and Ethernet 10/100M device utilizes 1700 D-FFs. Hence, there are 2300 D-FFs utilized, which leaves 120580 available. The table object can also show the processing power required by the system components. For example, the OPB arbiter utilizes 0.2 DMIPs, UART 16450 utilizes 1.4 DMIPs, and Ethernet 10/100M device utilizes 8.4 DMIPs. The total processing power required for use by the system components is 10 DMIPs. This leaves 290 DMIPs of the 300 DMIPS of the FPGA-based embedded processor SoC processing power resources for use by other system components.

Customization is typically constrained by the availability of FPGA-based embedded processor SoC resources. For example, the number of I/Os utilized by system components cannot exceed the number of I/Os of the FPGA-based embedded processor SoC. Advantageously, the GUI 350 can provide real-time resource utilization feedback during the selection and configuration stages of the FPGA-based embedded processor SoC development. By selecting a particular system component, the resources utilized by that system component can be immediately determined and displayed in the GUI 350. The resources can be itemized in order to simplify the tasks of selection and configuration of system components. In one aspect of the invention, each system component can have a corresponding application programming interface (API) the can provide an exact or estimated resource count.

Importantly, after all the system components have been selected, a system analysis and consistency check can be executed to ensure that the necessary system requirements and specification are met. For example, since processing delays can affect quality of service (QOS) in speech-based telephony applications, it is pertinent to ensure that processing delays caused by system components comply with the system specification and requirements. The system analyzer 120 (FIG. 1) can traverse the selected components and compute relevant resource allocation and usage statistics. These statistics can be used by the designer to optimize the allocation of system resources. System analyzer 120 can also provide functions, which can have the capability to determine system performance and power dissipation based on system component selection and parameter configuration.

Figure 4:
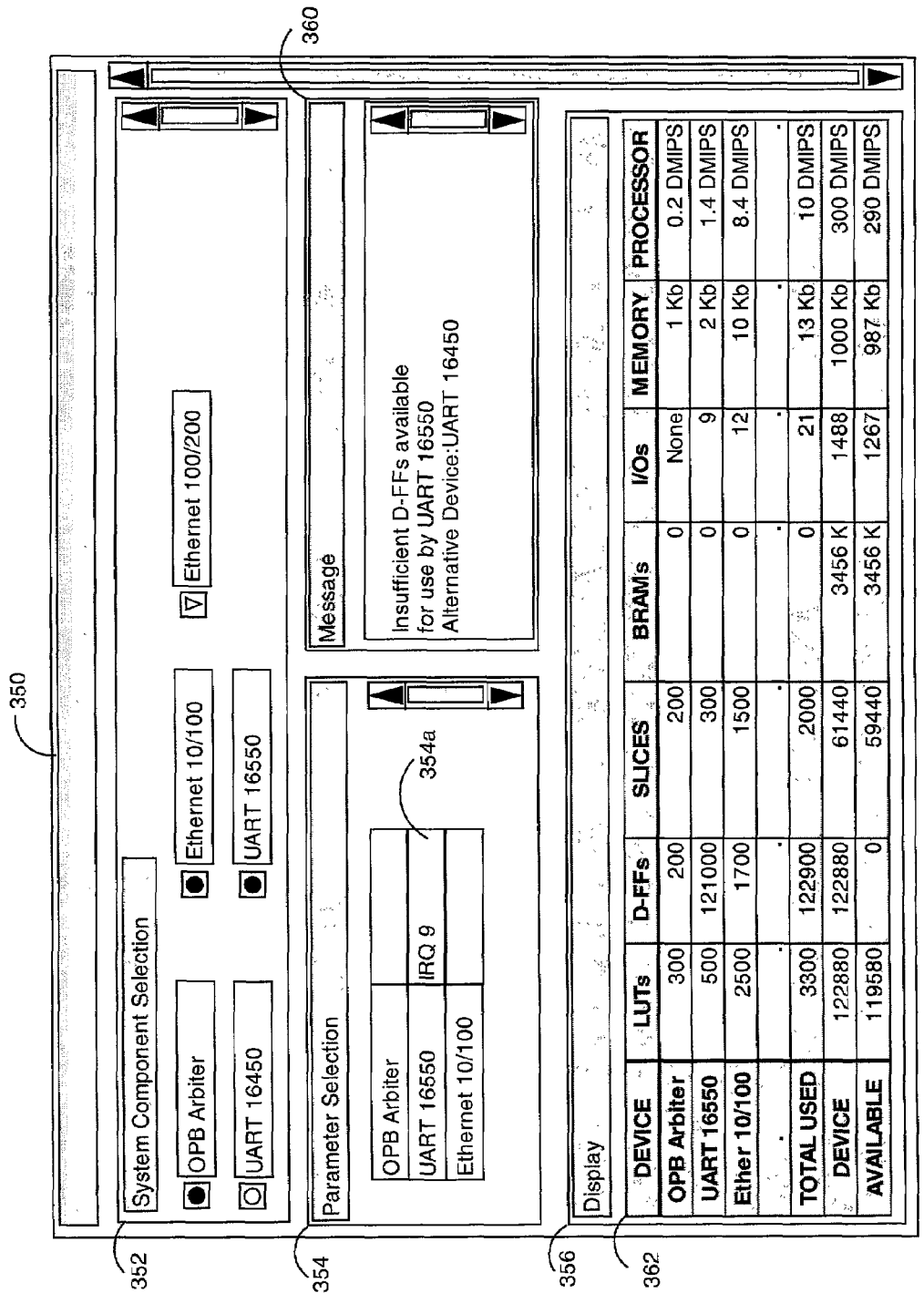
FIG. 4 depicts an exemplary analysis and consistency check in accordance with the invention.

FIG. 4 depicts an exemplary analysis and consistency check in accordance with the invention. Referring to FIG. 4, GUI 350 can include a message object 360 that can facilitate display of warning messages, error messages, inconsistency messages, and other types of messages and/or information. System component selection object 352 shows selected system components OPB arbiter, ethernet 10/100 and UART 16550. To illustrate an exemplary analysis and consistency check, assume that UART 16550 requires 121,000 D-FFS as shown in table object 362. The total D-FFs used by selected system components is 123,000. However, the resources are inadequate, since the device has only 122,880 D-FFs which can be used by system components. An error or inconsistency notification can be generated and displayed by message object 360 to flag the inadequate resource condition. Notably, message object 360 can provide a message which can state that there is "insufficient D-FFs available for use by UART 16550." The message object 360 can also display one or more alternative system components to UART 16550. In this case, message object 360 can indicate that UART 16450 is and alternative system component to UART 16550.

Advantageously, the ability to get real-time feedback and resource allocation can help the designer determine efficient resource allocation while configuring the system components used to customize the FPGA-based SoC. This can significantly reduce up-front development costs and non-recurring engineering costs and ultimately reduce the time to market. A method and system for optimal resource allocation in an FPGA-based SoC according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Additionally, the description above is intended by way of example only and is not intended to limit the present invention in any way, except as set forth in the following claims.

What is claimed is:

1. A method for allocation of resources for a field programmable gate array (FPGA)-based system on a chip (SoC), the method comprising:
   selecting a first system component for customizing the FPGA-based SoC;
   determining types and quantities of FPGA resources required for implementing the first system component and remaining available FPGA resources for the FPGA-based SoC subsequent to said selection of said first system component;
   displaying a respective quantity for each type of remaining available FPGA resource for the FPGA-based SoC, and a respective quantity of each type of resource used to implement said first system component;
   choosing a second system component to utilize said remaining available resources to facilitate allocation of FPGA resources to the FPGA-based SoC; and
   displaying a respective quantity of each type of FPGA resource utilized by said second system component.

2. The method according to claim 1, wherein said determining step further comprises determining total FPGA-based SoC resources.

3. The method according to claim 2, wherein said step of determining available resources further comprises computing a difference between said total FPGA-based SoC resources and resources utilized by said selected system component, to yield said determined available resources for the FPGA-based SoC.

4. The method according to claim 3, further comprising the step of choosing a third system component that utilizes no more than said available resources when said second system component utilizes more resources than said determined available resources, said third system component being an alternative to said second system component.

5. The method according to claim 4, wherein said step of choosing said third system component further comprises computing total resources utilized by said first system component and said third system component.

6. The method according to claim 5, wherein said step of choosing said third system component further comprises computing a difference between said determined available resources for the FPGA-based SoC and said computed total resources utilized by said first system component and said third system component.

7. The method according to claim 1, wherein said selecting step further comprises selecting a system component from a group consisting of hardware cores, software cores, hardware core parameters and software core parameters, buses, fixed-function FPGA resources, and user-specified design components.

8. The method according to claim 1, wherein the types of FPGA resources include look-up table, flip-flop, block memory, I/O buffer, memory, and processor, and displaying the types and quantities of FPGA resources includes displaying quantities for at least three of the types of FPGA resources.

9. A method for allocation of resources for a field programmable gate array (FPGA)-based system on a chip (SoC), the method comprising:
   selecting system components for customizing the FPGA-based SoC;
   computing types and quantities of FPGA resource usage for implementing said selected system components;
   for each of a plurality of types of the FPGA resources and for each of the selected system components, displaying a quantity of the FPGA resource usage for implementing the selected system component and displaying for each of the types of FPGA resources a quantity of the resource not required for implementing the selected system components; and
   distributing the FPGA-based SoC system resources among said selected system components according to said computed resource usage to customize said FPGA-based SoC.

10. The method according to claim 9, wherein said step of computing said resource usage further comprises determining resources to be used by at least one selected system component and determining FPGA-based SoC resources available for use by at least an unselected system component.

11. The method according to claim 10, further comprising:
   if said selected system component requires more FPGA-based SoC resources than said available FPGA-based SoC resources, providing an unavailable resource notification.

12. The method according to claim 11, further comprising the step of determining at least one alternative system component requiring less resources than said available FPGA-based SoC resources.

13. The method according to claim 12, wherein said determining step further comprises selecting said determined at least one alternative system component to customize the FPGA-based SoC.

14. The method according to claim 9, wherein said computing step further comprises determining incompatibility between said selected system components.

15. The method according to claim 14, wherein said determining step further comprises determining at least one alternative compatible system component for replacing an incompatible system component.

16. The method according to claim 9, wherein said selecting step further comprises selecting a system component from a group consisting of hardware cores, software cores, hardware core parameters and software core parameters, buses, fixed-function FPGA resources, and user-specified design components.

17. The method according to claim 16, further comprising the step of selecting a default parameter for said selected system component.

18. The method according to claim 17, wherein said step of selecting said default parameter for said selected system component further comprises the step of propagating said default parameter throughout said customization of the FPGA-based SoC.

19. The method according to claim 9, wherein the types of FPGA resources include look-up table, flip-flop, block memory, I/O buffer, memory, and processor, and displaying the types and quantities of FPGA resources includes displaying quantities for at least three of the types of FPGA resources.

20. A machine readable storage having stored thereon, a computer program having a plurality of code sections, said code sections executable by a machine for causing the machine to perform the steps of:
   selecting a first system component for allocating field programmable gate array (FPGA) resources while customizing a FPGA-based SoC;
   determining types and quantities of FPGA resources required for implementing the first system component and remaining available FPGA resources for said FPGA-based SoC subsequent to said selection of said first system component;

for each of a plurality of types of the FPGA-based SoC resources, displaying a quantity of the available resources for the FPGA-based SoC and a quantity of the FPGA resources required to implement the first system component; and choosing a second system component to utilize said remaining available resources to facilitate allocation of FPGA resources to the FPGA-based SoC; and displaying a respective quantity of each type of FPGA resource utilized by said second system component.

21. The machine readable storage according to claim 20, wherein said determining step further comprises determining total FPGA-based SoC resources.

22. The machine readable storage according to claim 21, wherein said step of determining available resources further comprises computing a difference between said total FPGA-based SoC resources and resources utilized by said selected system component, to yield said determined available resources for the FPGA-based SoC.

23. The machine readable storage according to claim 20, wherein the types of FPGA resources include look-up table, flip-flop, block memory, I/O buffer, memory, and processor, and displaying the types and quantities of FPGA resources includes displaying quantities for at least three of the types of FPGA resources.

24. A machine readable storage having stored thereon, a computer program having a plurality of code sections, said code sections executable by a machine for causing the machine to perform the steps of:

selecting system components for allocating resources for customizing a field programmable gate array (FPGA)-based system on a chip (SoC);

computing types and quantities of FPGA resource usage for implementing said selected system components;

for each of a plurality of types of the FPGA resources and for each of the selected system components, displaying a quantity of the FPGA resource usage for implementing the selected system component and displaying for each of the types of FPGA resources a quantity of the resource not required for implementing the selected system components; and distributing the FPGA-based SoC system resources among said selected system components according to said computed resource usage to customize said FPGA-based SoC.

25. The machine readable storage according to claim 24, wherein said step of computing said resource usage further comprises determining resources to be used by at least one selected system component and determining FPGA-based SoC resources available for use by an unselected system component.

26. The machine readable storage according to claim 25, further comprising, if said selected system component requires more FPGA-based SoC resources than said available FPGA-based SoC resources, providing an unavailable resource notification.

27. The machine readable storage according to claim 24, wherein said computing step further comprises determining incompatibility between said selected system components.

28. The machine readable storage according to claim 27, wherein said determining step further comprising determining at least one alternative compatible system component for replacing an incompatible system component.

29. The machine readable storage according to claim 24, wherein said selecting step further comprises selecting a system component from a group consisting of hardware cores, software cores, hardware core parameters and a software core parameters, buses, fixed-function FPGA resources, and user-specified design components.

30. The machine readable storage according to claim 24, wherein the types of FPGA resources include look-up table, flip-flop, block memory, I/O buffer, memory, and processor, and displaying the types and quantities of FPGA resources includes displaying quantities for at least three of the types of FPGA resources.

* * * * *